(12) United States Patent
Dudeck et al.

(10) Patent No.: US 7,826,301 B2
(45) Date of Patent: Nov. 2, 2010

(54) WORD LINE DRIVER CIRCUIT WITH REDUCED LEAKAGE

(75) Inventors: Dennis E. Dudeck, Hazleton, PA (US); Donald Albert Evans, Lancaster, OH (US); Hai Quang Pham, Hatfield, PA (US); Wayne E. Werner, Coopersburg, PA (US); Ronald James Wozniak, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 251 days.

(21) Appl. No.: 12/295,745

(22) PCT Filed: Aug. 28, 2007

(86) PCT No.: PCT/US2007/077001

§ 371 (c)(1),
(2), (4) Date: Oct. 2, 2008

(87) PCT Pub. No.: WO2009/029094

PCT Pub. Date: Mar. 5, 2009

(65) Prior Publication Data

US 2010/0165778 A1      Jul. 1, 2010

(51) Int. Cl.
  *G11C 8/00*         (2006.01)
(52) U.S. Cl. .......................... 365/230.06; 365/230.04; 365/230.1; 365/230.11
(58) Field of Classification Search ............ 365/230.06, 365/230.04, 230.1, 230.11
See application file for complete search history.

(56) References Cited

U.S. PATENT DOCUMENTS

| 5,373,479 | A  | * | 12/1994 | Noda ................... 365/230.06 |
| 6,603,702 | B2 | * | 8/2003  | Kojima ................ 365/230.06 |
| 7,646,653 | B2 | * | 1/2010  | Choi et al. ............. 365/189.09 |

FOREIGN PATENT DOCUMENTS

| EP | 0606650 | 7/1994 |
| WO | 2006/040633 | 4/2006 |
| WO | PCT/US2007/077001 | 6/2008 |

* cited by examiner

*Primary Examiner*—Pho M Luu
(74) *Attorney, Agent, or Firm*—Ryan, Mason & Lewis, LLP

(57) ABSTRACT

A word line driver circuit for use in a memory array including multiple memory cells and multiple word lines coupled to the memory cells for selectively accessing the memory cells includes a driver adapted to generate a word line signal as a function of a first set of address signals received by the word line driver circuit. The circuit further includes a switching circuit having a plurality of output nodes, the output nodes connected to respective ones of the plurality of word lines, and having an input node connected to an output of the driver and adapted to receive the word line signal. The switching circuit is operative to direct the word line signal to a selected one of the word lines during a memory access as a function of at least one control signal. Between a given pair of memory accesses, the output nodes and the input node of the switching circuit are held to a same prescribed voltage level to thereby substantially eliminate a leakage current path in the switching circuit.

20 Claims, 3 Drawing Sheets

WORD LINE DRIVER CIRCUIT WITH REDUCED LEAKAGE

FIELD OF THE INVENTION

The present invention relates generally to electronic circuits, and more particularly relates to word line driver circuits.

BACKGROUND OF THE INVENTION

Reducing power consumption in memory devices is becoming more important, particularly in view of their growing use in mobile applications. Moreover, as semiconductor device geometries shrink, leakage current in these devices increases, thereby exacerbating the problem. For example, in a memory array (e.g., random access memory (RAM)) which includes a plurality of bit lines and word lines for selectively accessing one or more memory cells in the memory array, a word line column is responsible for a large portion of the overall leakage current due, at least in part, to the large number of driver circuits employed therein.

Memory arrays typically include row decode circuitry employing a decoder and a word line driver for driving a given word line to a logic high (e.g., "1") or a logic low (e.g., "0") voltage level in order to selectively enable read or write access devices associated with a corresponding row of memory cells connected to the given word line. Each row of memory cells in the memory array requires a word line driver to drive the access devices of all the memory cells in that row. Thus, for even moderate size memory arrays, the word line load can be quite large, thereby requiring large word line drivers in order to achieve reasonable memory access times. Unfortunately, leakage current in the driver generally increases with the size of the driver.

One conventional approach to reducing leakage current in a word line driver is to employ a pair of stacked PMOS devices connected to each word line at an intermediate node between the two devices. Specifically, a source of a first p-channel metal-oxide-semiconductor (PMOS) device is connected to a voltage supply of the word line driver, a drain of the first device is connected to a source of a second PMOS device at the intermediate node, a drain of the second device is connected to a voltage return of the circuit, and gates of the two devices are connected to one or more control signals. The methodology of using stacked PMOS devices, however, relies on sub-threshold leakage current to lower a voltage at the intermediate node of the PMOS stack. As a result, it takes a significant amount of time for the intermediate node to equalize to a low-current state following a word line access.

Accordingly, there exists a need for an improved word line driver capable of driving a large load but which does not suffer from one or more of the above-noted problems exhibited by conventional word line drivers.

SUMMARY OF THE INVENTION

The present invention meets the above-noted need by providing, in illustrative embodiments thereof, a word line driver circuit having reduced leakage current without significantly increasing a size of the circuit. To accomplish this, a driver circuit in accordance with an illustrative embodiment of the invention advantageously groups multiple rows of word line drivers into a single driver and employs a switching circuit to direct which word line in the group is to be driven at any given time.

In accordance with an embodiment of the invention, a word line driver circuit for use in a memory array including multiple memory cells and multiple word lines coupled to the memory cells for selectively accessing the memory cells includes a driver adapted to generate a word line signal as a function of a first set of address signals received by the word line driver circuit. The circuit further includes a switching circuit having a plurality of output nodes, the output nodes connected to respective ones of the plurality of word lines, and having an input node connected to an output of the driver and adapted to receive the word line signal. The switching circuit is operative to direct the word line signal to a selected one of the word lines during a memory access as a function of at least one control signal. Between a given pair of memory accesses, the output nodes and the input node of the switching circuit are held to a same prescribed voltage level to thereby substantially eliminate a leakage current path in the switching circuit.

In accordance with other embodiments of the invention, the switching circuit may include a plurality of transmission gates, each of the transmission gates, at a first node thereof, connected to a corresponding one of the word lines, and a plurality of switch devices. Each of the switch devices may be connected to the first node of a corresponding one of the transmission gates and operative to selectively connect a corresponding one of the word lines to a prescribed voltage level when the transmission gate connected thereto is disabled. The output of the driver may be connected to a second node of each of the plurality of transmission gates and adapted to receive the first set of address signals for activating a selected one of the word lines via a corresponding one of the transmission gates. The word line driver circuit may further include a control circuit operative to generate multiple control signals, each of the control signals selectively enabling a respective one of the transmission gates. The control circuit is operative to receive a second set of address signals and to generate the control signals as a function thereof.

In accordance with another embodiment of the invention, a system having reduced leakage current includes a memory array including multiple memory cells and multiple word lines coupled to the memory cells for selectively accessing the memory cells. The system further includes at least one word line driver circuit coupled to the memory array. The word line driver circuit includes a driver adapted to generate a word line signal as a function of a first set of address signals received by the word line driver circuit. The circuit further includes a switching circuit having a plurality of output nodes, the output nodes connected to respective ones of the plurality of word lines, and having an input node connected to an output of the driver and adapted to receive the word line signal. The switching circuit is operative to direct the word line signal to a selected one of the word lines during a memory access as a function of at least one control signal. Between a given pair of memory accesses, the output nodes and the input node of the switching circuit are held to a same prescribed voltage level to thereby substantially eliminate a leakage current path in the switching circuit.

These and other objects, features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative word line driver circuits for use, for example, in a memory array including a plurality of memory cells and a plurality of word lines coupled to the memory cells for selectively accessing the memory cells. It should be understood, however, that the present invention is not limited to these or any other particular circuit arrangements. Rather, the invention is more generally applicable to techniques for reducing word line driver leakage current in semiconductor memory designs without significantly impacting performance and area.

Although implementations of the present invention described herein may be implemented using PMOS and n-channel metal-oxide-semiconductor (NMOS) transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Figure 1:
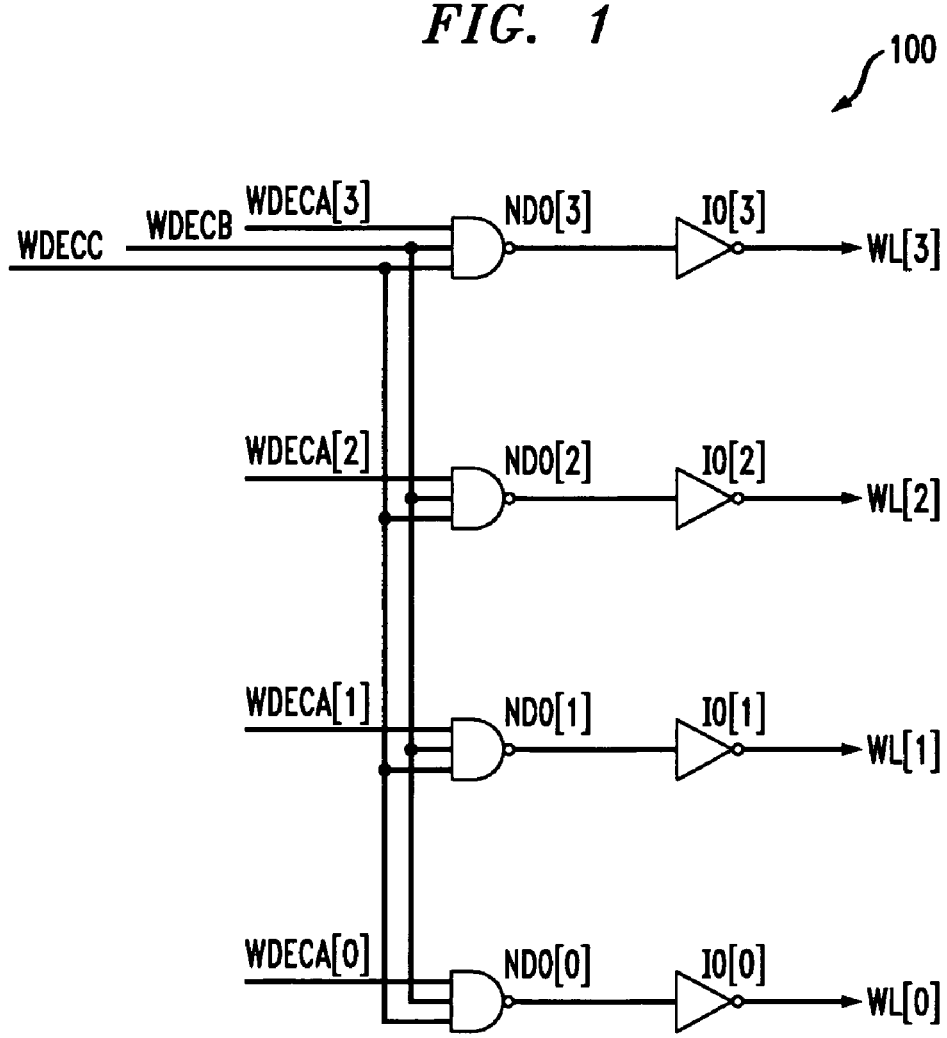
FIG. 1 is a schematic diagram depicting at least a portion of an illustrative word line driver circuit which can be modified to implement techniques of the present invention.

FIG. 1 is a schematic diagram depicting at least a portion of an illustrative word line driver circuit 100 which can be modified to implement techniques of the present invention. Driver circuit 100 includes a plurality of 3-input NAND gates ND0[0], ND0[1], ND0[2] and ND0[3]. Inputs to the NAND gates typically come from pre-decoded address signals which traverse vertically through the word line driver column. More particularly, first inputs of NAND gates ND0[0], ND0[1], ND0[2] and ND0[3] preferably receive a corresponding address signal WDECA[0], WDECA[1], WDECA[2] and WDECA[3], respectively, a second input of each of the NAND gates receives address signal WDECB, and a third input of each of the NAND gates receives address signal WDECC. Address signals WDECA[3:0] may be generated from two pre-decode word address bits. During a memory access, only one of the WDECA signals will go high. The WDECB and WDECC signal groups are preferably also pre-decoded word address bits, with all the various combinations making up the word line decode.

An output of each of the NAND gates ND0[0], ND0[1], ND0[2] and ND0[3] drives an input of a corresponding inverter I0[0], I0[1], I0[2] and I0[3], respectively, or alternative driver. An output of each of the inverters I0[0], I0[1], I0[2] and I0[3], in turn, drives a corresponding word line, WL[0], WL[1], WL[2] and WL[3], respectively. Inverters I0[0], I0[1], I0[2] and I0[3] may be implemented in a traditional manner, comprising a PMOS device and an NMOS device connected together in series between a voltage supply (e.g., VDD) and a voltage return (e.g., ground) of the circuit 100, as will be known by those skilled in the art. Since each of the word lines WL[0], WL[1], WL[2] and WL[3] typically presents a rather large capacitive load for even a moderate size memory array, inverters I0[0], I0[1], I0[2] and I0[3] are required to be large so as to have sufficient drive capability in order to achieve reasonable memory access times demanded of modern memory systems. Accordingly, the most significant leakage current in the driver circuit 100 is generated from inverters I0[0], I0[1], I0[2] and I0[3], predominantly where the PMOS devices therein are turned off but are still contributing to the overall leakage current.

As stated above, one approach to reducing leakage current in the word line driver circuit is to employ a pair of stacked PMOS devices connected to each word line at an intermediate node between the two devices. The methodology of using stacked PMOS devices, however, relies on sub-threshold leakage current to lower a voltage at the intermediate node of the PMOS stack. As a result, it takes a significant amount of time for the intermediate node to equalize to a low-current state following a word line access. Moreover, other than sub-threshold currents, the intermediate node is essentially floating between accesses and, as such, cannot be assumed to be at a reliable voltage level or to track with voltage supply bounce and noise. For at least these reasons, the stacked PMOS device approach is undesirable.

Figure 2:
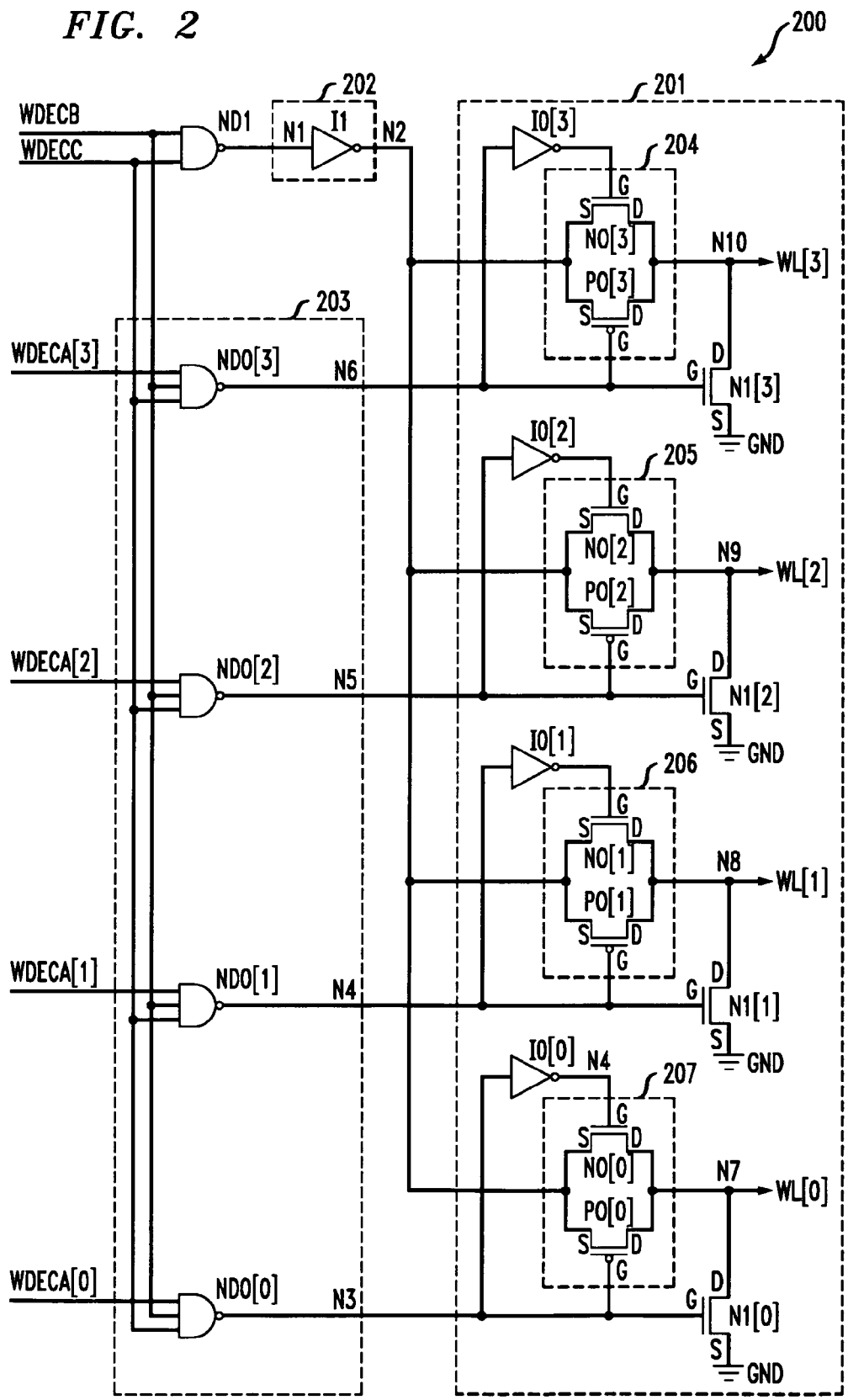
FIG. 2 is a schematic diagram depicting at least a portion of an exemplary word line driver circuit, formed in accordance with an embodiment of the present invention.

FIG. 2 is a schematic diagram depicting at least a portion of an exemplary word line driver circuit 200, formed in accordance with an embodiment of the invention. Driver circuit 200 beneficially reduces leakage current primarily by reducing the number of individual drivers in the circuit. To accomplish this, the exemplary driver circuit 200 advantageously groups multiple rows of word line drivers, preferably consecutive, into a single driver and employs a plurality of complementary transmission gates, or an alternative switching arrangement, to direct which word line in the group is to be driven at any given time. In between memory accesses, or otherwise when a given word line is disabled, both sides of the complementary transmission gate corresponding to the disabled word line are held at a prescribed voltage, which may be zero volts (e.g., ground). As a result, the transmission gates contribute essentially no leakage current. Although the exemplary driver circuit 200 shows four word line drivers combined and controlled by a single driver, it is to be understood that the invention is not limited to any specific number of drivers which can be grouped. Rather, illustrative embodiments of the invention are easily scalable, so that a smaller number of word line drivers (e.g., 2) or a larger number of word line drivers (e.g., 8, 16, 32, etc.) can be grouped to achieve different amounts of leakage current reduction.

More particularly, word line driver circuit 200 includes a switching circuit 201 and a driver 202 connected to the switching circuit. Driver 202 may be implemented, for example, using an inverter, I1, as shown, although alternative driver configurations are contemplated. Moreover, although shown as an inverting driver, a non-inverting driver may be similarly employed. Driver 202 preferably receives a decoded address signal at an input thereof (e.g., node N1), which is a function of a first set of address signals, WDECB and WDECC, provided to the word line driver circuit 200, and generates a word line signal at an output of the driver (e.g., node N2) as a function of the first set of address signals. The decoded address signal is preferably generated by a decoder, which may comprise a two-input NAND gate, ND1, or an alternative decoding arrangement. Signals WDECB and WDECC presented to decoder NAND ND1 are preferably pre-decoded word address bits supplied to word line driver circuit 200, with all the various combinations making up the word line decode.

It is to be understood that in the exemplary word line driver circuit 200, four word line drivers are grouped by driver 202, and thus only two address signals are required to decode four word lines to be driven. Additional address signals would be required to decode more than four word lines. For example, if eight word lines are being driven by a single driver, three address signals would be required and a three-input NAND may be used in place of NAND ND1, as will become apparent to those skilled in the art. Alternative decoding arrangements are similarly contemplated by the invention.

Switching circuit 201 includes an input node connected to the output node N2 of driver 201 and a plurality of output nodes, N7, N8, N9 and N10, each output node connecting to a corresponding one of word lines WL[0], WL[1], WL[2] and WL[3], respectively, to be driven. Word lines WL[3], WL[2], WL[1] and WL[0] may be referred to herein collectively as WL[3:0]. In order to direct which of the word lines is being driven at any given time, switching circuit 201 preferably includes a plurality of transmission gates, 204, 205, 206 and 207. A first node of each of the transmission gates 204, 205, 206, 207 is connected to the output of driver 202 at node N2. A second node of each of the transmission gates 204, 205, 206 and 207 connects to a corresponding one of the word lines WL[3], WL[2], WL[2] and WL[0] at nodes N10, N9, N8 and N7, respectively. Each of transmission gates 204, 205, 206, 207 is activated by a corresponding control signal presented thereto. The control signals may be generated internally by word line driver circuit 200 (as will be described herein below), or they may be supplied to the word line driver circuit externally. During a given memory access, switching circuit 201 is preferably operative to direct the word line signal received from driver 202 to a selected one of word lines WL[3:0] via a corresponding activated transmission gate 204, 205, 206, 207, respectively.

Each of the transmission gates 204, 205, 206, 207 preferably includes a pair of complementary metal-oxide-semiconductor (MOS) devices connected together in parallel. More particularly, transmission gate 207 includes a first PMOS device, P0[0], having a source (S) connected to the output of driver 202 at node N2, a drain (D) connecting to corresponding word line WL[0], and a gate (0) for receiving a first one of the control signals, and a first NMOS device, N0[0], having a source connected to the source of device P0[0], a drain connected to the drain of P0[0], and a gate for receiving a logical complement of the first control signal supplied to the gate of P0[0]. Likewise, transmission gate 206 includes a second PMOS device, P0[1], having a source connected to the output of driver 202 at node N2, a drain connecting to corresponding word line WL[1], and a gate for receiving a second one of the control signals, and an NMOS device, N0[1], having a source connected to the source of P0[1], a drain connected to the drain of P0[1], and a gate for receiving a logical complement of the second control signal supplied to the gate of P0[1]. Transmission gate 205 includes a third PMOS device, P0[2], having a source connected to the output of driver 202 at node N2, a drain connecting to corresponding word line WL[2], and a gate for receiving a third one of the control signals, and an NMOS device, N0[2], having a source connected to the source of P0[2], a drain connected to the drain of P0[2], and a gate for receiving a logical complement of the third control signal supplied to the gate of P0[2]. Transmission gate 204 includes a fourth PMOS device, P0[3], having a source connected to the output of driver 202 at node N2, a drain connecting to corresponding word line WL[3], and a gate for receiving a fourth one of the control signals, and an NMOS device, N0[3], having a source connected to the source of P0[3], a drain connected to the drain of P0[3], and a gate for receiving a logical complement of the fourth control signal supplied to the gate of P0[3]. The logical complements of the first, second, third and fourth control signals may be generated, for example, by inverters I0[0], I0[2] and I0[3], respectively, or they may be supplied to switching circuit 201 externally along with the control signals.

It is to be appreciated that, because a MOS device is symmetrical in nature, and thus bidirectional, the assignment of source and drain designations in the MOS device is essentially arbitrary. Therefore, the source and drain may be referred to herein generally as first and second source/drain, respectively, where "source/drain" in this context denotes a source or a drain.

Switching circuit 201 may further include a plurality of NMOS pull-down devices, N1[3], N1[2], N1[1] and N1[0], which may be referred to herein as devices N1[3:0], for setting word lines WL[3:0], respectively, to a prescribed voltage level, which may be zero volts (e.g., ground). Devices N1[3:0] are preferably activated by the same control signals as used to activate transmission gates 204 through 207. Specifically, a drain of device N1[3] connects to word line WL[3], a source of N1[3] connects to ground, or an alternative voltage source, and a gate of N1[3] is connected to a gate of device P0[3] in transmission gate 204 and is adapted to receive the fourth control signal. A drain of device N1[2] connects to word line WL[2], a source of N1[2] connects to ground, or an alternative voltage source, and a gate of N1[2] is connected to a gate of device P0[2] in transmission gate 205 and is adapted to receive the third control signal. A drain of device N1[1] connects to word line WL[1], a source of N1[1] connects to ground, or an alternative voltage source, and a gate of N1[1] is connected to a gate of device P0[1] in transmission gate 206 and is adapted to receive the second control signal. A drain of device N1[0] connects to word line WL[0], a source of N1 [0] connects to ground, or an alternative voltage source, and a gate of N1[0] is connected to a gate of device P0[0] in transmission gate 207 and is adapted to receive the first control signal. In an alternative embodiment, depending on the relative timing between the input to driver 202 at node N1 and control inputs to the switching circuit 201 at nodes N3, N4, N5 and N6, the driver can also be used to return the word lines to ground potential after a memory access rather than using pull-down devices N1[3:0].

As stated above, switching circuit 201 is operative to selectively control which word line is to be connected to driver 202, via a corresponding one of the transmission gates, during a given memory access. During the memory access, only one of the word lines is preferably connected to the driver 202, and therefore a word line not being accessed through its corresponding transmission gate will essentially be floating. In order to prevent possible problems resulting from the word lines being at an undefined voltage level, devices N1[3:0] are active, to thereby set the respective word lines to a prescribed voltage level (e.g., zero volts), when the corresponding transmission gates connected to the respective devices N1[3:0] are disabled, as is the case between memory accesses. Between memory accesses, both sides of each of transmission gates 204, 205, 206, 207 are set to the same voltage level. As a result, a leakage current path in switching circuit 201 is eliminated so that the switching circuit consumes substantially no leakage current.

The single driver 202 in word line driver circuit 200 which drives multiple transmission gates 204, 205, 206, 207 remains the primary source of leakage current. However, since the number of drivers is reduce by at least a factor of the number of word lines being grouped together, the overall leakage is reduced by substantially the same factor. For example, if four word lines are grouped together with one driver driving four transmission gates, as in the illustrative word line driver circuit 200, then the overall leakage current will be one quarter of what it would otherwise be using four separate drivers, thus achieving a leakage current reduction of about 75 percent. Since word line drivers typically use longer than minimum channel lengths or use high threshold implants to reduce leakage, adding serial transmission gates, which can utilize minimum channel lengths and minimum thresholds, in the drive path greatly reduces the performance impact of using this approach. Furthermore, to recoup some of the performance impact of adding the transmission gates, inverter I1 in driver 202 can be increased in size and yet retain its overall reduction in leakage current.

The control signals for selectively activating transmission gates 204, 205, 206 and 207 are preferably generated by a control circuit 203, included in word line driver circuit 200, as a function of a second set of address signals supplied to the word line driver circuit. The second set of address signals preferably comprises the first set of address signals, namely, signals WDECB and WDECC, as well as address signals, WDECA[3], WDECA[2], WDECA[1] and WDECA[0], each of is uniquely associated with a selected word line to be accessed. In alternative embodiments of the invention, the first and second sets of address signals may comprise mutually exclusive signals. Address signals WDECA[3], WDECA[2], WDECA[1] and WDECA[0], which may be referred to herein collectively as WDECA[3:0], are preferably generated by two pre-decode word address bits. During a given memory access, only one of the signals WDECA[3:0] associated with the group of combined word lines will become active (e.g., logic high; "1"). Between memory accesses, signals WDECA[3:0] are preferably inactive (e.g., logic low; "0").

Control circuit 203 includes a plurality of three-input NAND gates, ND0[3], ND0[2], ND0[1] and ND0[0], which may be referred to herein collectively as ND0[3:0], each of the NAND gates providing a logical AND function. A first input of each of NAND gates ND0[3:0] receives address signal WDECB, a second input of each of NAND gates ND0[3:0] receives address signal WDECC, and a third input of NAND gates ND0[3:0] is adapted to receive a corresponding one of address signals WDECA[3:0], respectively. Each of NAND gates ND0[3:0] is operative to generate a respective one of the control signals for selectively activating a corresponding one of the transmission gates. Specifically, NAND ND0[0] generates the control signal at node N3 for activating transmission gate 207, NAND ND0[1] generates the control signal at node N4 for activating transmission gate 206, NAND ND0[2] generates the control signal at node N5 for activating transmission gate 205, and NAND ND0[3] generates the control signal at node N6 for activating transmission gate 204. It is to be appreciated that control circuit 203 may be easily modified to provide control signals when a fewer or greater number of word lines are combined. For example, control circuit 203 may be modified to support eight word lines by expanding the number of address signals employed from WDECA[3:0] to WDECA[7:0], as will become apparent to those skilled in the art from the teachings set forth herein.

By way of example only and without loss of generality, consider the operation of the word line driver circuit 200 in selecting word line WL[2] for access. During a memory access, address signal WDECA[2] will be a logic high level (e.g., "1") and address signals WDECA[0], WDECA[1] and WDECA[3] will each be a logic low level (e.g., "0"). With WDECA[0], WDECA[1] and WDECA[3] being low, respective outputs of NAND gates ND0[0], ND0[1] and ND0[3] will be a logic high level (regardless of signals WDECB and WDECC) thereby disabling corresponding transmission gates 207, 206 and 204 and turning on pull-down devices N1[0], N1[1] and N1[3]. With devices N1[0], N1[1] and N1[3] active, word lines WL[0], WL[1] and WL[3] will be set to ground (e.g., zero volts).

Address signals WDECB and WDECC will be a logic high level during the memory access. As a result, driver 202 will generate a logic high word line signal on node N2. This active high word line signal, however, will not be directed to word lines WL[0], WL[1] and WL[3] since corresponding transmission gates 207, 206 and 204, respectively, are disabled. With signals WDECA[2], WDECB and WDECC all at a logic high level, NAND ND0[2] will generate a logic low level at node N5, thereby enabling corresponding transmission gate 205 and turning off pull-down device N1[2]. With transmission gate 205 activated, the active high word line signal generated by driver 202 will be directed to word line WL[2]. Between memory accesses (e.g., once memory access is completed), address signals WDECA[3:0], WDECB and WDECC will return to a logic low level, thereby disabling all transmission gates 204, 205, 206, 207 and activating all pull-down devices N[3:0]. Likewise, driver 202 will generate a logic low level word line signal at node N2. As stated above, since both nodes of the respective transmission gates are held to the same voltage level between memory accesses, there will be no leakage current path through the switching circuit 201, and the only source of leakage is attributed to driver 202.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Figure 3:
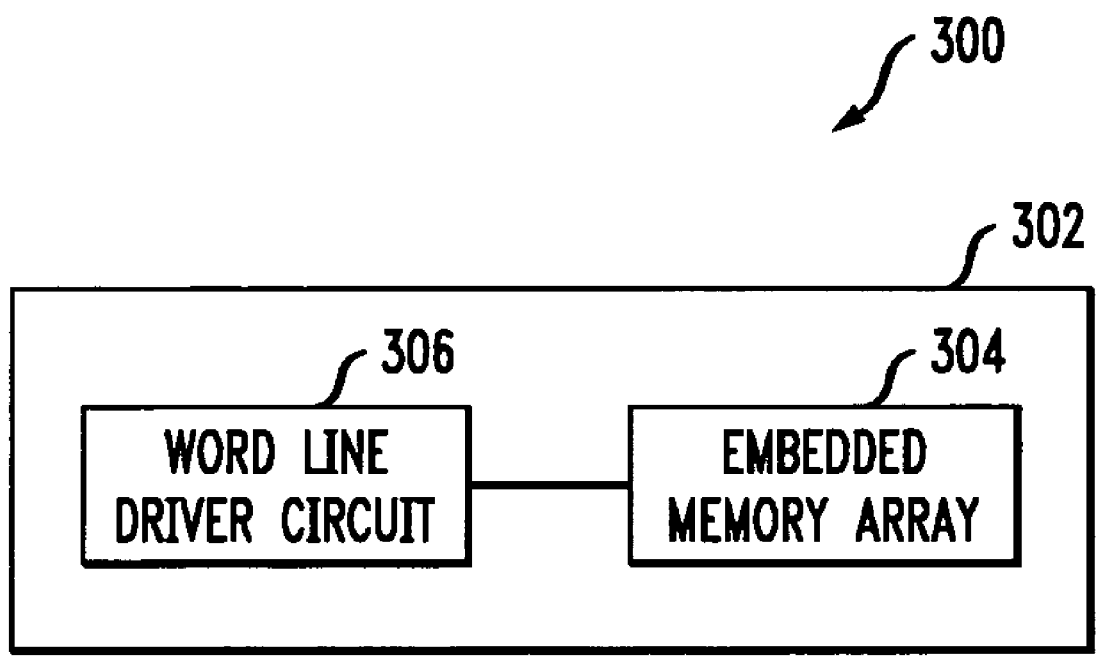
FIG. 3 is a block diagram depicting a system including embedded memory and a word line driver circuit, formed in accordance with another embodiment of the present invention.

FIG. 3 depicts an exemplary system 300 including at least one integrated circuit 302, formed in accordance with another embodiment of the invention. Integrated circuit 302 comprises an embedded memory array 304 and a word line driver circuit 306 connected to the memory array. Word line driver circuit 306 may comprise, for example, word line driver circuit 200 shown in FIG. 2 and described herein above.

An integrated circuit in accordance with the present invention can be employed in any application and/or electronic system which uses memory, embedded or otherwise. Suitable systems for implementing techniques of the invention may include, but are not limited, to personal computers, communication networks, electronic instruments (e.g., automated test equipment (ATE)), interface networks, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A word line driver circuit for use in a memory array including a plurality of memory cells and a plurality of word lines coupled to the memory cells for selectively accessing the memory cells, the word line driver circuit comprising:
   a driver adapted to generate a word line signal as a function of a first set of address signals received by the word line driver circuit; and
   a switching circuit having a plurality of output nodes, the output nodes connected to respective ones of the plurality of word lines, and having an input node connected to an output of the driver and adapted to receive the word line signal, the switching circuit being operative to direct the word line signal to a selected one of the word lines during a memory access as a function of at least one control signal;
   wherein between a given pair of memory accesses, the output nodes and the input node of the switching circuit are held to a same prescribed voltage level to thereby substantially eliminate a leakage current path in the switching circuit.

2. The word line driver circuit of claim 1, further comprising a control circuit operative to generate the at least one control signal as a function of a second set of address signals received by the word line driver circuit.

3. The word line driver circuit of claim 2, wherein the control circuit is operative to generate a plurality of control signals, the control circuit comprising a plurality of logical AND function elements, each of the AND function elements being operative to receive at least a subset of the second set of address signals, at least one address signal in the subset of the second set of address signals being unique to each of the respective AND function elements, each of the AND function elements generating a respective one of the plurality of control signals so as to selectively activate a corresponding one of the word lines.

4. The driver circuit of claim 2, wherein the control circuit is operative to generate a plurality of control signals, the control circuit comprising a plurality of three-input logical NAND gates, a first input of each of the NAND gates receiving a first one of the address signals in the second set of address signals, a second input of each of the NAND gates receiving a second one of the address signals in the second set of address signals, and a third input of each of the NAND gates receiving a unique one of the address signals in the second set of address signals, the NAND gates generating respective ones of the plurality of control signals at outputs thereof as a function of the respective inputs to the NAND gates.

5. The word line driver circuit of claim 1, wherein the control circuit is operative to generate a plurality of control signals, wherein the switching circuit comprises a plurality of switch elements, each of the switch elements connected to a corresponding one of the word lines at a first node and receiving the word line signal at a second node, each of the switch elements being selectively activated by a corresponding one of the control signals.

6. The word line driver circuit of claim 5, wherein at least one of the switch elements comprises a transmission gate.

7. The word line driver circuit of claim 5, wherein at least one of the switch elements comprises a complementary pass gate.

8. The word line driver circuit of claim 7, wherein the complementary pass gate comprises:
   a PMOS device including a first source/drain connected to the input node of the switching circuit, a second source/drain connected to a corresponding one of the output nodes of the switching circuit, and a gate for receiving a corresponding one of the control signals; and
   an NMOS device including a first source/drain connected to the first source/drain of the PMOS device, a second source/drain connected to the second source/drain of the PMOS device, and a gate for receiving a logical complement of the corresponding one of the control signals.

9. The word line driver circuit of claim 1, wherein the switching circuit further comprises a plurality of transistor devices, each of the transistor devices connected to a corresponding one of the word lines and being operative to selectively connect the respective word lines to a prescribed voltage level when the word lines are not being accessed.

10. The word line driver circuit of claim 9, wherein at least one of the transistor devices is an NMOS device having a first source/drain connected to a corresponding one of the word lines, a second source/drain connecting to a voltage source having the prescribed voltage level, and a gate for receiving a corresponding one of a plurality of control signals.

11. The word line driver circuit of claim 9, wherein the prescribed voltage level is substantially equal to zero volts.

12. The word line driver circuit of claim 1, wherein the driver comprises:
   a decoder circuit operative to receive the first set of address signals and to generate a decoded address signal as a function thereof; and
   an inverter having an input connected to the decoder circuit and an output for generating the word line signal as a function of the decoded address signal.

13. The word line driver circuit of claim 12, wherein the decoder circuit comprises a logical AND function element, the AND function element receiving at least a portion of the first set of address signals and generating the decoded address signal as a function thereof for selecting a given one of the word lines.

14. The word line driver circuit of claim 12, wherein the decoder circuit comprises a two-input logical NAND gate, a first input of the NAND gate receiving a first one of the address signals in the first set of address signals, a second input of the NAND gate receiving a second one of the address signals in the first set of address signals, and an output of the NAND gate generating the decoded address signal as a function of the first and second one of the address signals in the first set of address signals.

15. The word line driver circuit of claim 1, wherein at least a portion of the signals in at least one of the first and second sets of address signals comprises pre-decoded address signals.

16. The word line driver circuit of claim 1, wherein at least one of the address signals in first set of address signals is the same as one of the address signals in the second set of address signals.

17. The word line driver circuit of claim 1, wherein:
   the switching circuit comprises: a plurality of transmission gates, each of the transmission gates, at a first node thereof, connected to a corresponding one of the word lines; and a plurality of switch devices, each of the switch devices being connected to the first node of a corresponding one of the transmission gates and being operative to selectively connect a corresponding one of the word lines to a prescribed voltage level when the transmission gate connected thereto is disabled;
   the output of the driver is connected to a second node of each of the plurality of transmission gates and is adapted to receive the first set of address signals for activating a selected one of the word lines via a corresponding one of the transmission gates;

the word line driver circuit further comprising a control circuit operative to generate a plurality of control signals, each of the control signals selectively enabling a respective one of the transmission gates, the control circuit being operative to receive a second set of address signals and to generate the control signals as a function thereof.

18. The word line driver circuit of claim 1, further comprising a control circuit operative to generate the plurality of control signals as a function of a second set of address signals presented to the word line driver circuit.

19. An integrated circuit comprising at least one word line driver circuit according to claim 1.

20. A system having reduced leakage current, comprising:

a memory array including a plurality of memory cells and a plurality of word lines coupled to the memory cells for selectively accessing the memory cells; and at least one word line driver circuit coupled to the memory array, the word line driver circuit comprising:

a driver adapted to generate a word line signal as a function of a first set of address signals received by the word line driver circuit; and a switching circuit having a plurality of output nodes, the output nodes connected to respective ones of the plurality of word lines, and having an input node connected to an output of the driver and adapted to receive the word line signal, the switching circuit being operative to direct the word line signal to a selected one of the word lines during a memory access as a function of at least one control signal;

wherein between a given pair of memory accesses, the output nodes and the input node of the switching circuit are held to a same prescribed voltage level to thereby substantially eliminate a leakage current path in the switching circuit.

* * * * *